(12) United States Patent
Jeong

(10) Patent No.: US 8,390,368 B2
(45) Date of Patent: Mar. 5, 2013

(54) INTERNAL VOLTAGE GENERATING CIRCUIT

(75) Inventor: Hyun Sik Jeong, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 146 days.

(21) Appl. No.: 13/096,540

(22) Filed: Apr. 28, 2011

(65) Prior Publication Data

US 2011/0304384 A1 Dec. 15, 2011

(30) Foreign Application Priority Data

Jun. 9, 2010 (KR) .................. 10-2010-0054317

(51) Int. Cl.
*G05F 1/10* (2006.01)
(52) U.S. Cl. ....................................... 327/541
(58) Field of Classification Search .......... 327/534, 327/535, 537, 538, 540, 541, 543
See application file for complete search history.

(56) References Cited

U.S. PATENT DOCUMENTS 7,109,783 B1 * 9/2006 Kondapalli et al. ........... 327/540
7,183,838 B2 * 2/2007 Iwase ............................ 327/541
7,289,377 B2 * 10/2007 Do .......................... 365/189.09

FOREIGN PATENT DOCUMENTS

KR 100930394 B1 12/2009

* cited by examiner

*Primary Examiner* — Jeffrey Zweizig
(74) *Attorney, Agent, or Firm* — William Park & Associates Ltd.

(57) ABSTRACT

An internal voltage generating circuit includes a supply voltage driving unit, an internal voltage driving unit, and a driving control unit. The supply voltage driving unit is configured to compare a voltage division signal of a supply voltage with a bias voltage, generate a first pull-up signal, and drive the supply voltage in response to the first pull-up signal. The internal voltage driving unit is configured to receive the supply voltage, generate a second pull-up signal, and drive an internal voltage. The driving control unit is configured to select the first pull-up signal or a power supply voltage as a third pull-up signal.

26 Claims, 5 Drawing Sheets

INTERNAL VOLTAGE GENERATING CIRCUIT

CROSS-REFERENCES TO RELATED APPLICATIONS

The present application claims priority under 35 U.S.C 119(a) to Korean Application No. 10-2010-0054317, filed on Jun. 9, 2010, in the Korean intellectual property Office, which is incorporated herein by reference in its entirety set forth in full.

BACKGROUND

Embodiments of the present invention relate to an internal voltage generating circuit, and more particularly, to an internal voltage generating circuit that can reduce the power consumption by controlling a supply voltage driving force according to the level of an interval voltage.

In general, a semiconductor memory device receives a power supply voltage VDD and a ground voltage VSS from an external device to generate an internal voltage necessary for an internal operation. Examples of the voltages necessary for the internal operations of a memory device include a core voltage VCORE supplied to a memory core region, a high voltage VPP used to drive a word line or used in the event of overdriving, and a back-bias voltage VBB supplied as a bulk voltage of an NMOS transistor of a core region.

Meanwhile, a bit line pre-charge voltage VBLP supplied to pre-charge a bit line pair BL/BL in a pre-charge operation and a cell plate voltage VCP supplied to a memory cell are driven by the core voltage VCORE. Thus, a sufficient number of core voltage driving circuits are configured to rapidly supply a current necessary to generate the bit line pre-charge voltage VBLP and the cell plate voltage VCP.

A known core voltage driving circuit drives a core voltage VCORE when performing an active operation, and stops the driving of the core voltage VCORE when not performing the active operation. However, even when the active operation is in progress, if the bit line pre-charge voltage VBLP and the cell plate voltage VCP reach a target level, there is no need to apply the core voltage VCORE in order to generate the bit line pre-charge voltage VBLP and the cell plate voltage VCP. However, even when there is no need to apply the core voltage VCORE in order to generate the bit line pre-charge voltage VBLP and the cell plate voltage VCP, the known core voltage driving circuit continues to drive the core voltage VCORE, thus causing unnecessary power consumption.

SUMMARY

An embodiment of the present invention relates to an internal voltage generating circuit that can reduce the power consumption by controlling a supply voltage driving force according to the level of an interval voltage.

In an embodiment of the present invention, an internal voltage generating circuit includes a supply voltage driving unit configured to compare a voltage division signal of a supply voltage with a bias voltage, generate a first pull-up signal, and drive the supply voltage in response to the first pull-up signal, an internal voltage driving unit configured to receive the supply voltage, generate a second pull-up signal, and drive an internal voltage, and a driving control unit configured to select the first pull-up signal or a power supply voltage as a third pull-up signal in response to the second pull-up signal, and control the driving of the supply voltage.

In another embodiment of the present invention, an internal voltage generating circuit includes a supply voltage driving unit configured to compare a voltage division signal of a supply voltage with a bias voltage, generate a first pull-up signal, and drive the supply voltage in response to the first pull-up signal, a first internal voltage driving unit configured to receive the supply voltage, generate a second pull-up signal, and drive a first internal voltage, a second internal voltage driving unit configured to receive the supply voltage, generate a third pull-up signal, and drive a second internal voltage, and a driving control unit configured to select the first pull-up signal or a power supply voltage as a fourth pull-up signal in response to the second pull-up signal and the third pull-up signal, and control the driving of the supply voltage.

In another embodiment of the present invention, an internal voltage generating circuit includes an internal voltage driving unit configured to receive a supply voltage, generate a first pull-up signal, and drive an internal voltage, a control signal generating unit configured to generate a control signal in response to the first pull-up signal, and a supply voltage driving unit configured to compare a voltage division signal of the supply voltage with a bias voltage, and generate a second pull-up signal for driving the supply voltage, wherein the second pull-up signal is driven in response to the control signal.

In another embodiment of the present invention, an internal voltage generating circuit includes, a first internal voltage driving unit configured to receive a supply voltage, generate a first pull-up signal, and drive a first internal voltage, a second internal voltage driving unit configured to receive the supply voltage, generate a second pull-up signal, and drive a second internal voltage, a control signal generating unit configured to generate a control signal in response to the first pull-up signal and the second pull-up signal, and a supply voltage driving unit configured to compare a voltage division signal of the supply voltage with a bias voltage, and generate a third pull-up signal for driving the supply voltage, wherein the third pull-up signal is driven in response to the control signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
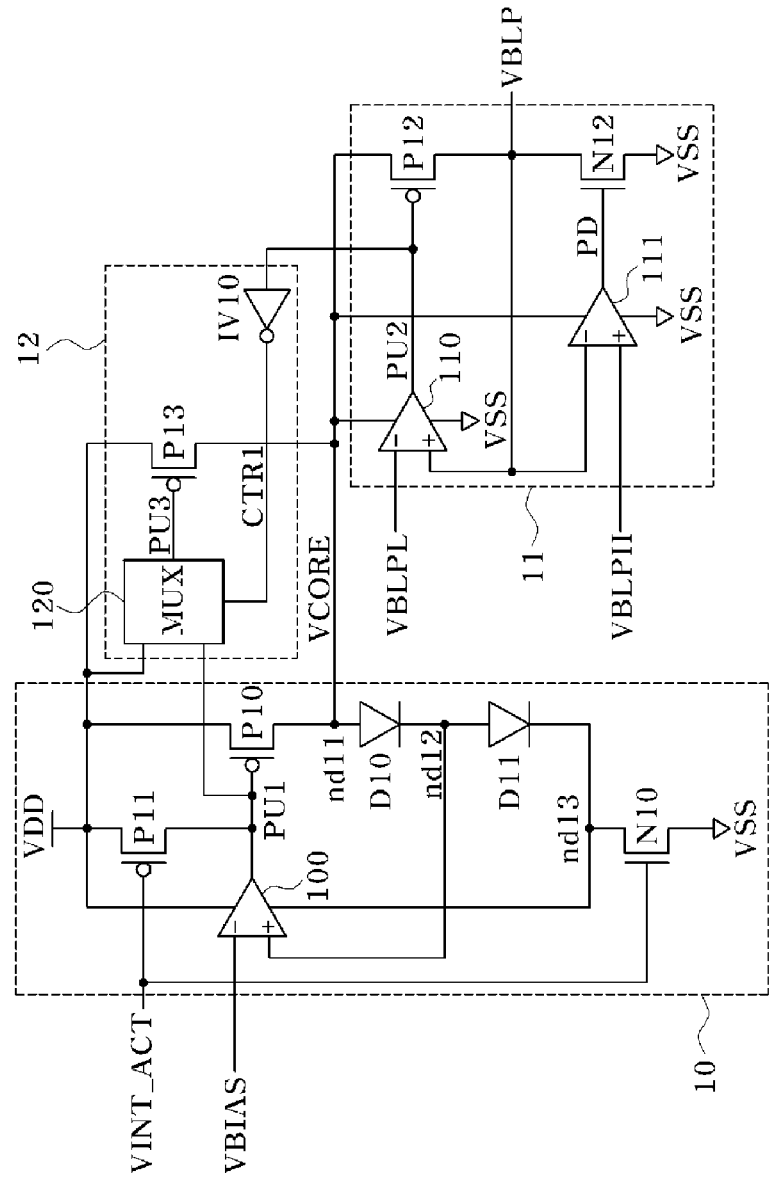
FIG. 1 is a circuit diagram of an internal voltage generating circuit according to an embodiment of the present invention.

FIG. 1 is a circuit diagram of an internal voltage generating circuit according to an embodiment of the present invention.

Figure 2:
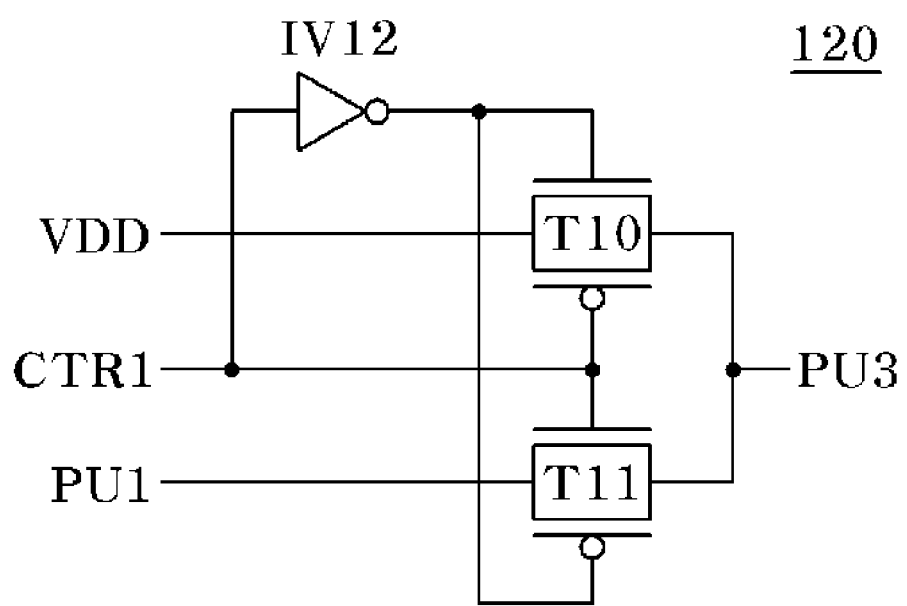
FIG. 2 is a circuit diagram of a multiplexer included in the internal voltage generating circuit illustrated in FIG. 1.

FIG. 2 is a circuit diagram of a multiplexer included in the internal voltage generating circuit illustrated in FIG. 1.

Referring to FIG. 1, an internal voltage generating circuit according to the embodiment of the present invention includes a supply voltage driving unit 10, an internal voltage driving unit 11, and a driving control unit 12.

The supply voltage driving unit 10 includes diodes D10 and D11, a comparator 100, PMOS transistors P10 and P11, and an NMOS transistor N10. The diodes D10 and D11 are connected in series between a node nd11 and a node nd13 to divide a core voltage VCORE (i.e., a supply voltage) and output the same to a node nd12. The comparator 100 is configured to compare a signal of the node nd12 with a bias voltage VBIAS and generate a first pull-up signal PU1. The PMOS transistor P10 is configured to be turned on in response to the first pull-up signal PU1, and to pull up the voltage level of the node nd11 (the core voltage VCORE) to a power supply voltage VDD. The PMOS transistor P11 is configured to be turned on in response to an active signal VINT_ACT of a logic high level in an active operation, and to pull up the first pull-up signal PU1 to the power supply voltage VDD. The NMOS transistor N10 is configured to be turned on in response to the active signal VINT_ACT, and pull down the voltage level of the node nd13 to a ground voltage VSS.

Accordingly, in an active operation, when the signal of the node nd12 generated by dividing the core voltage VCORE has a lower level than the bias voltage VBIAS, the PMOS transistor P10 of the supply voltage driving unit 10 is turned on, and the core voltage VCORE is pulled up to the power supply voltage VDD. On the other hand, when an active operation is not performed, the PMOS transistor P11 of the supply voltage driving unit 10 is turned on, the first pull-up signal PU1 is pulled up to the power supply voltage VDD, and stops the driving of the core voltage VCORE.

The internal voltage driving unit 11 includes a first comparator 110, a second comparator 111, a PMOS transistor P12, and an NMOS transistor N12. The first comparator 110 is configured to compare a bit line pre-charge voltage VBLP (i.e., an internal voltage) with a first lowest reference voltage VBLPL and generate a second pull-up signal PU2. The second comparator 111 is configured to compare the bit line pre-charge voltage VBLP with a first highest reference voltage VBLPH and generate a pull-down signal PD. The PMOS transistor P12 is configured to be turned on in response to the second pull-up signal PU2 and pull up the bit line pre-charge voltage VBLP. The NMOS transistor N12 is configured to be turned on in response to the pull-down signal PD and pull down the bit line pre-charge voltage VBLP.

Accordingly, when the bit line pre-charge voltage VBLP has a lower level than the first lowest reference voltage VBLPL, the internal voltage generating unit 11 generates the second pull-up signal PU2 of a logic low level and drives the bit line pre-charge voltage VBLP to the core voltage VCORE. When the bit line pre-charge voltage VBLP has a higher level than the first lowest reference voltage VBLPL, the internal voltage generating unit 11 generates the second pull-up signal PU2 of a logic high level and stops the driving of the bit line pre-charge voltage VBLP by the core voltage VCORE.

The driving control unit 12 includes an inverter IV10, a multiplexer 120, and a PMOS transistor P13. The inverter IV10 operates as a buffer that inverts/buffers the second pull-up signal PU2 and generates first control signal CTR1. The multiplexer 120 is configured to transmit the power supply voltage VDD or the first pull-up signal PU1 as a third pull-up signal PU3 in response to the first control signal CTR1. The PMOS transistor P13 is configured to pull up the core voltage VCORE to the power supply voltage VDD in response to the third pull-up signal PU3.

Referring to FIG. 2, the multiplexer 120 includes a first transmission gate T10 and a second transmission gate T11. The first transmission gate T10 is configured to transmit the power supply voltage VDD as the third pull-up signal PU3 when the first control signal CTR1 has a logic low level. The second transmission gate T11 is configured to transmit the first pull-up signal PU1 as the third pull-up signal PU3 when the first control signal CTR1 has a logic high level.

Accordingly, when the first control signal CTR1 of a logic high level is generated, the driving control unit 12 transmits the first pull-up signal PU1 as the third pull-up signal PU3 to maintain the driving of the core voltage VCORE. When the first control signal CTR1 of a logic low level is generated, the driving control unit 12 transmits the power supply voltage VDD as the third pull-up signal PU3 to stop the driving of the core voltage VCORE.

Hereinafter, operations of the internal voltage generating circuit according to this embodiment will be described. The operations are divided into an operation for the case where the bit line pre-charge voltage VBLP has a lower level than the first lowest reference voltage VBLPL in an active operation and an operation for the case where the bit line pre-charge voltage VBLP has a higher level than the first lowest reference voltage VBLPL.

When the bit line pre-charge voltage VBLP has a lower level than the first lowest reference voltage VBLPL, the bit line pre-charge voltage VBLP is driven to the core voltage VCORE in response to the second pull-up signal PU2 of a logic low level. In this case, the first control signal CTR1 of the driving control unit 12 is activated to a logic high level to transmit the first pull-up signal PU1 as the third pull-up signal PU3. Thus, the core voltage VCORE is driven according to the level of the first pull-up signal PU1.

When the bit line pre-charge voltage VBLP has a higher level than the first lowest reference voltage VBLPL, the driving of the bit line pre-charge voltage VBLP is stopped in response to the second pull-up signal PU2 of a logic high level. In this case, the first control signal CTR1 of the driving control unit 12 is deactivated to a logic low level to transmit the power supply voltage VDD as the third pull-up signal PU3. Thus, the PMOS transistor P13 is turned off regardless of the level of the core voltage VCORE, to reduce the core voltage (VCORE) driving force.

As described above, even when an active operation is in progress, if there is no need to drive the bit line pre-charge voltage VBLP to the core voltage VCORE because the bit line pre-charge voltage VBLP has a higher level than the first lowest reference voltage VBLPL, the internal voltage generating circuit of this embodiment reduces the core voltage (VCORE) driving force, thus reducing unnecessary power consumption.

Figure 3:
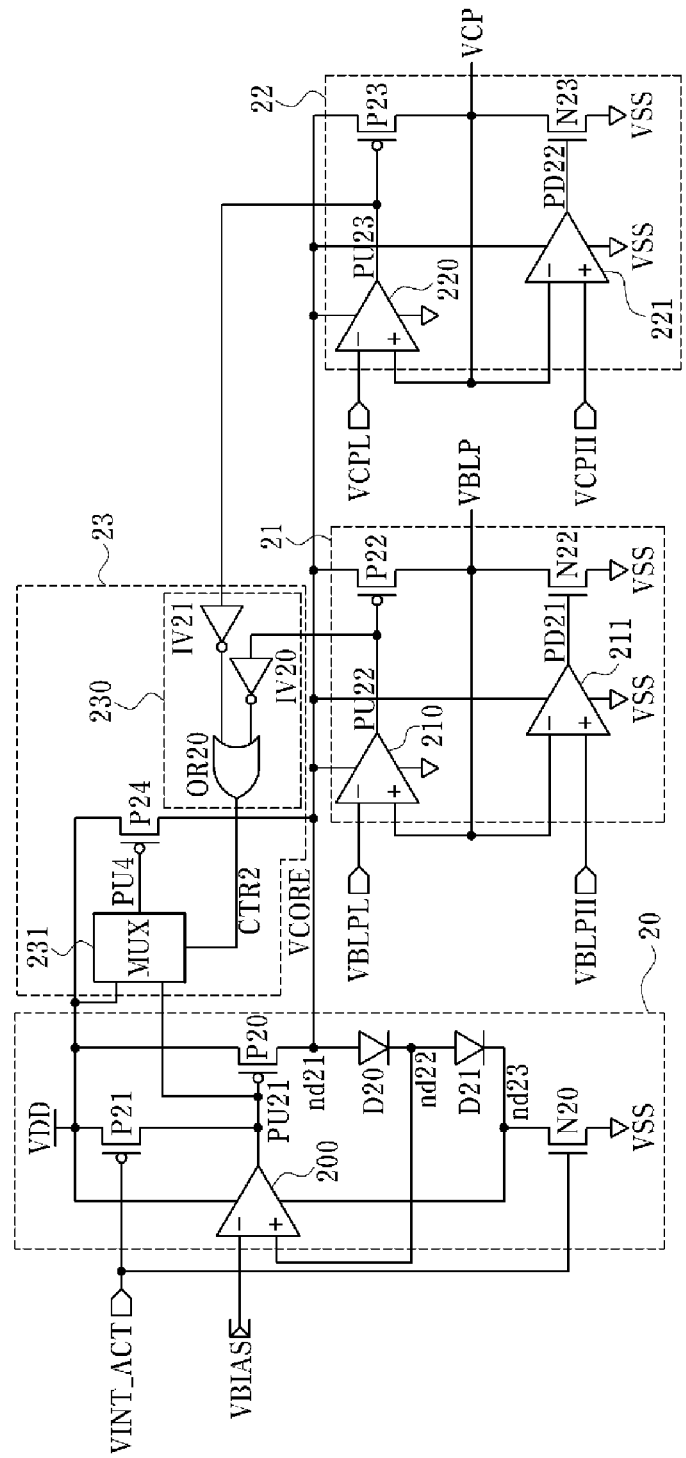
FIG. 3 is a circuit diagram of an internal voltage generating circuit according to another embodiment of the present invention.

FIG. 3 is a circuit diagram of an internal voltage generating circuit according to another embodiment of the present invention.

Referring to FIG. 3, an internal voltage generating circuit according to another embodiment of the present invention includes a supply voltage driving unit 20, a first internal voltage driving unit 21, a second internal voltage driving unit 22, and a driving control unit 23.

The supply voltage driving unit 20 includes diodes D20 and D21, a comparator 200, a PMOS transistor P20, a PMOS transistor P21, and an NMOS transistor N20. The diodes D20 and D21 are connected in series between a node nd21 and a node nd23 to divide a core voltage VCORE (i.e., a supply voltage) and output the same to a node nd22. The comparator 200 is configured to compare a signal of the node nd22 with a bias voltage VBIAS and generate a first pull-up signal PU21. The PMOS transistor P20 is configured to be turned on in response to the first pull-up signal PU21 and pull up the core voltage VCORE to a power supply voltage VDD. The PMOS transistor P21 operates as a driving element that is turned on in response to an active signal VINT_ACT of a logic high level in an active operation to pull up the first pull-up signal PU21 to the power supply voltage VDD. The NMOS transistor N20 is configured to be turned on in response to the active signal VINT_ACT and pull down the node nd23 to a ground voltage VSS. Accordingly, in an active operation, when the signal of the node nd22 generated by dividing the core voltage VCORE has a lower level than the bias voltage VBIAS, the PMOS transistor P20 of the supply voltage driving unit 20 is turned on, and pull up the core voltage VCORE. On the other hand, when an active operation is not performed, the PMOS transistor P21 of the supply voltage driving unit 20 is turned on, pulls up the first pull-up signal PU21 to the power supply voltage VDD, and stops the driving of the core voltage VCORE.

The first internal voltage driving unit 21 includes a first comparator 210, a second comparator 211, a PMOS transistor P22, and an NMOS transistor N22. The first comparator 210 is configured to compare a bit line pre-charge voltage VBLP (i.e., an internal voltage) with a first lowest reference voltage VBLPL and generate a second pull-up signal PU22. The second comparator 211 is configured to compare the bit line pre-charge voltage VBLP with a first highest reference voltage VBLPH and generate a first pull-down signal PD21. The PMOS transistor P22 is configured to be turned on in response to the second pull-up signal PU22 and pull up the bit line pre-charge voltage VBLP. The NMOS transistor N22 is configured to be turned on in response to the first pull-down signal PD21 and pull down the bit line pre-charge voltage VBLP. Accordingly, when the bit line pre-charge voltage VBLP has a lower level than the first lowest reference voltage VBLPL, the first internal voltage driving unit 21 generates the second pull-up signal PU22 of a logic low level and drives the bit line pre-charge voltage VBLP to the core voltage VCORE. When the bit line pre-charge voltage VBLP has a higher level than the first lowest reference voltage VBLPL, the first internal voltage driving unit 21 generates the second pull-up signal PU22 of a logic high level to stop the driving of the bit line pre-charge voltage VBLP by the core voltage VCORE.

The second internal voltage driving unit 22 includes a third comparator 220, a fourth comparator 221, a PMOS transistor P23, and an NMOS transistor N23. The third comparator 220 is configured to compare a cell plate voltage VCP (i.e., an internal voltage) with a second lowest reference voltage VCPL and generate a third pull-up signal PU23. The fourth comparator 221 is configured to compare the cell plate voltage VCP with a second highest reference voltage VCPH and generate a second pull-down signal PD22. The PMOS transistor P23 is configured to be turned on in response to the third pull-up signal PU23 and pull up the cell plate voltage VCP. The NMOS transistor N23 is configured to be turned on in response to the second pull-down signal PD22 and pull down the cell plate voltage VCP. Accordingly, when the cell plate voltage VCP has a lower level than the second lowest reference voltage VCPL, the second internal voltage driving unit 22 generates the third pull-up signal PU23 of a logic low level and drives the cell plate voltage VCP to the core voltage VCORE. When the cell plate voltage VCP has a higher level than the second lowest reference voltage VCPL, the second internal voltage driving unit 22 generates the third pull-up signal PU23 of a logic high level to stop the driving of the cell plate voltage VCP by the core voltage VCORE.

The driving control unit 23 includes a control signal generating unit 230, a multiplexer 231, and a PMOS transistor P24. The control signal generating unit 230 is configured to generate a second control signal CTR2 of a logic low level when both the second pull-up signal PU22 and the third pull-up signal PU23 have a logic high level. The multiplexer is configured to transmit the power supply voltage VDD or the first pull-up signal PU21 as a fourth pull-up signal PU4 in response to the second control signal CTR2. The PMOS transistor P24 is configured to drive the core voltage VCORE to the power supply voltage VDD in response to the fourth pull-up signal PU4. The control signal generating unit 230 includes an inverter IV20, an inverter IV21, and an OR gate OR20. The inverter IV20 is configured to invert the second pull-up signal PU22. The inverter IV21 is configured to invert the third pull-up signal PU23. The OR gate OR20 is configured to receive an output signal of the inverter IV20 and an output signal of the inverter IV21, perform a logical OR operation on the output signal of the inverter IV20 and the output signal of the inverter IV21, and generate the second control signal CTR2. Accordingly, when the second control signal CTR2 of a logic high level is generated, the driving control unit 23 transmits the first pull-up signal PU21 as the fourth pull-up signal PU4 to maintain the driving of the core voltage VCORE. When the second control signal CTR2 of a logic low level is generated, the driving control unit 23 transmits the power supply voltage VDD as the fourth pull-up signal PU4 to stop the driving of the core voltage VCORE.

Hereinafter, a description will be given of the operation of the internal voltage generating circuit according to this embodiment, which is divided into an operation for the case where the bit line pre-charge voltage VBLP has a lower level than the first lowest reference voltage VBLPL in an active operation, an operation for the case where the cell plate voltage VCP has a lower level than the second lowest reference voltage VCPL, and an operation for the case where the bit line pre-charge voltage VBLP has a higher level than the first lowest reference voltage VBLPL and the cell plate voltage VCP has a higher level than the second lowest reference voltage VCPL.

When the bit line pre-charge voltage VBLP has a lower level than the first lowest reference voltage VBLPL, the bit line pre-charge voltage VBLP is driven to the core voltage VCORE in response to the second pull-up signal PU22 of a logic low level. In this case, the second control signal CTR2 of the driving control unit 23 is activated to a logic high level to transmit the first pull-up signal PU21 as the fourth pull-up signal PU4. Thus, the core voltage VCORE is driven according to the level of the first pull-up signal PU21.

When the cell plate voltage VCP has a lower level than the second lowest reference voltage VCPL, the cell plate voltage VCP is driven to the core voltage VCORE in response to the third pull-up signal PU23 of a logic low level. In this case, the second control signal CTR2 of the driving control unit 23 is activated to a logic high level to transmit the first pull-up signal PU21 as the fourth pull-up signal PU4. Thus, the core voltage VCORE is driven according to the level of the first pull-up signal PU21.

When where the bit line pre-charge voltage VBLP has a higher level than the first lowest reference voltage VBLPL and the cell plate voltage VCP has a higher level than the second lowest reference voltage VCPL, the driving of the bit line pre-charge voltage VBLP is stopped in response to the second pull-up signal PU22 of a logic high level and the driving of the cell plate voltage VCP is stopped in response to the third pull-up signal PU23 of a logic high level. In this case, the second control signal CTR2 of the driving control unit 23 is deactivated to a logic low level to transmit the power supply voltage VDD as the fourth pull-up signal PU4. Thus, the PMOS transistor P24 is turned off regardless of the level of the core voltage VCORE, to reduce the core voltage (VCORE) driving force.

As described above, even when an active operation is in progress, if there is no need to drive the bit line pre-charge voltage VBLP to the core voltage VCORE because the bit line pre-charge voltage VBLP has a higher level than the first lowest reference voltage VBLPL and there is no need to drive the cell plate voltage VCP to the core voltage VCORE because the cell plate voltage VCP has a higher level than the second lowest reference voltage VCPL, the internal voltage generating circuit of this embodiment reduces the core voltage (VCORE) driving force, thus reducing unnecessary power consumption.

Figure 4:
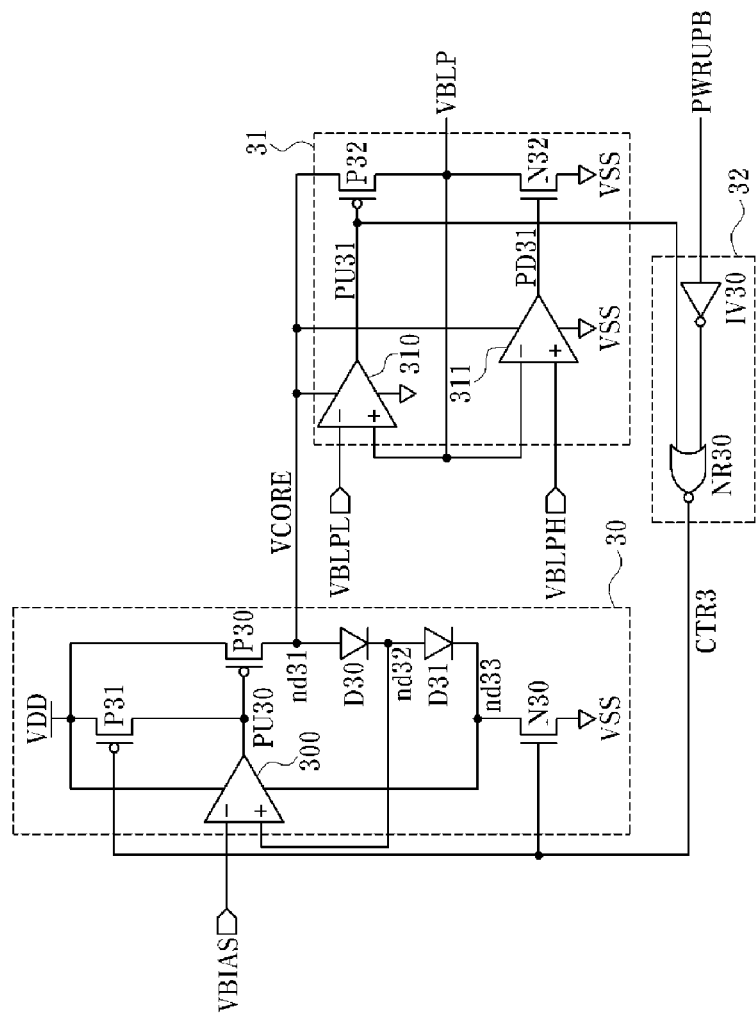
FIG. 4 is a circuit diagram of an internal voltage generating circuit according to another embodiment of the present invention.

FIG. 4 is a circuit diagram of an internal voltage generating circuit according to another embodiment of the present invention.

Referring to FIG. 4, an internal voltage generating circuit according to another embodiment of the present invention includes a supply voltage driving unit 30, an internal voltage driving unit 31, and a control signal generating unit 32.

The supply voltage driving unit 30 includes diodes D30 and D31, a comparator 300, a PMOS transistor P30, a PMOS transistor P31, and an NMOS transistor N30. The diodes D30 and D31 are connected in series between a node nd31 and a node nd33 to divide a core voltage VCORE (i.e., a supply voltage) and output the same to a node nd32. The comparator 300 is configured to compare a signal of the node nd32 with a bias voltage VBIAS and generate a first pull-up signal PU30. The PMOS transistor P30 is configured to be turned on in response to the first pull-up signal PU30 and pull up the core voltage VCORE to a power supply voltage VDD. The PMOS transistor P31 operates as a driving element that is turned on in response to a third control signal CTR3 and pulls up the first pull-up signal PU30 to the power supply voltage VDD. The NMOS transistor N30 is configured to be turned on in response to the third control signal CTR3 and pull down the node nd33 to a ground voltage VSS.

Accordingly, when the third control signal CTR3 has a logic high level, the supply voltage driving unit 30 compares the signal of the node nd32, which is generated by dividing the core voltage VCORE, with the bias voltage VBIAS to determine whether to drive the core voltage VCORE. That is, when the signal of the node nd32 has a lower level than the bias voltage VBIAS, the PMOS transistor P30 of the supply voltage driving unit 30 is turned on, and pulls up the core voltage VCORE. On the other hand, when the third control signal CTR3 has a logic low level, the PMOS transistor P31 of the supply voltage driving unit 30 is turned on, pulls up the first pull-up signal PU30 to the power supply voltage VDD, and stops the driving of the core voltage VCORE.

The internal voltage driving unit 31 includes a first comparator 310, a second comparator 311, a PMOS transistor P32, and an NMOS transistor N32. The first comparator 310 is configured to compare a bit line pre-charge voltage VBLP (i.e., an internal voltage) with a first lowest reference voltage VBLPL and generate a second pull-up signal PU31. The second comparator 311 is configured to compare the bit line pre-charge voltage VBLP with a first highest reference voltage VBLPH and generate a pull-down signal PD31. The PMOS transistor P32 is configured to be turned on in response to the second pull-up signal PU31 and pull up the bit line pre-charge voltage VBLP. The NMOS transistor N32 is configured to be turned on in response to the pull-down signal PD31 and pull down the bit line pre-charge voltage VBLP.

Accordingly, when the bit line pre-charge voltage VBLP has a lower level than the first lowest reference voltage VBLPL, the internal voltage driving unit 31 generates the second pull-up signal PU31 of a logic low level and drives the bit line pre-charge voltage VBLP to the core voltage VCORE. When the bit line pre-charge voltage VBLP has a higher level than the first lowest reference voltage VBLPL, the internal voltage driving unit 31 generates the second pull-up signal PU31 of a logic high level to stop the driving of the bit line pre-charge voltage VBLP by the core voltage VCORE.

The control signal generating unit 32 includes an inverter IV30 and a NOR gate NR30. The inverter IV30 is configured to invert a power-up signal PWRUPB. The NOR gate NR30 is configured to receive the second pull-up signal PU31 and an output signal of the inverter IV30, perform a logical NOR operation on the second pull-up signal PU31 and the output signal of the inverter IV30, and generate a third control signal CTR3. Herein, the power-up signal PWRUPB has a logic low level in a power-up period, and changes to a logic high level after termination of the power-up period. Accordingly, the control signal generating unit 32 generates the third control signal CTR3 of a logic low level in a power-up period or when the second pull-up signal PU31 has a logic high level.

Hereinafter, a description will be given of the operation of the internal voltage generating circuit according to this embodiment, which is divided into an operation for the case where the bit line pre-charge voltage VBLP has a lower level than the first lowest reference voltage VBLPL in an active operation and an operation for the case where the bit line pre-charge voltage VBLP has a higher level than the first lowest reference voltage VBLPL.

When the bit line pre-charge voltage VBLP has a lower level than the first lowest reference voltage VBLPL, the bit line pre-charge voltage VBLP is driven to the core voltage VCORE in response to the second pull-up signal PU31 of a logic low level. In this case, the control signal generating unit 32 generates the third control signal CTR3 of a logic high level to turn off the PMOS transistor P31 of the supply voltage driving unit 30. Thus, the core voltage VCORE is driven according to the level of the first pull-up signal PU30.

When the bit line pre-charge voltage VBLP has a higher level than the first lowest reference voltage VBLPL, the driving of the bit line pre-charge voltage VBLP is stopped in response to the second pull-up signal PU31 of a logic high level. In this case, the control signal generating unit 32 generates the third control signal CTR3 of a logic low level to turn on the PMOS transistor P31 of the supply voltage driving unit 30. Thus, the PMOS transistor P30 is turned off regardless of the level of the core voltage VCORE, to stop the driving of the core voltage VCORE.

As described above, even when an active operation is in progress, if there is no need to drive the bit line pre-charge voltage VBLP to the core voltage VCORE because the bit line pre-charge voltage VBLP has a higher level than the first lowest reference voltage VBLPL, the internal voltage generating circuit of this embodiment stops the driving of the core voltage VCORE, thus reducing unnecessary power consumption.

Figure 5:
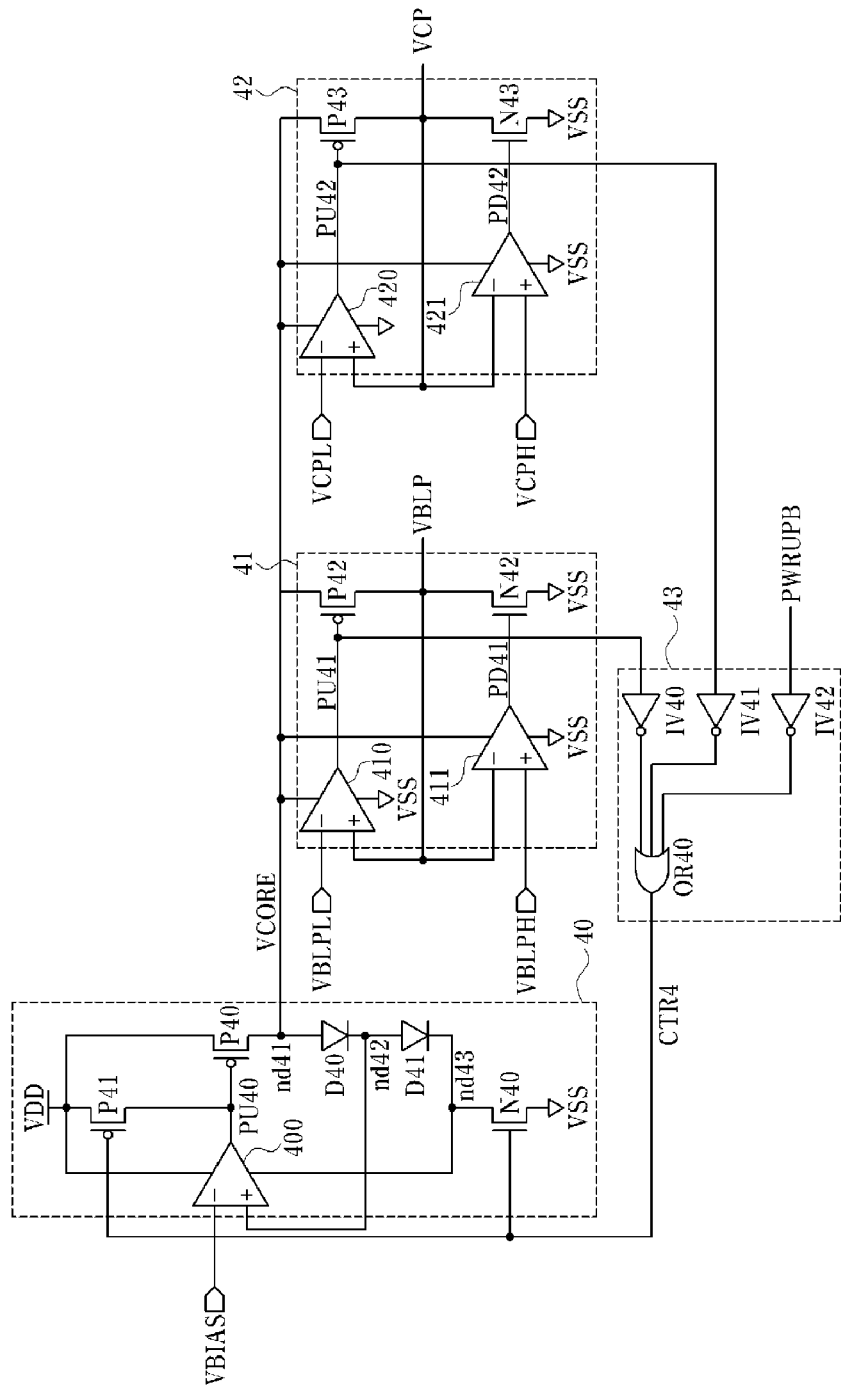
FIG. 5 is a circuit diagram of an internal voltage generating circuit according to another embodiment of the present invention.

FIG. 5 is a circuit diagram of an internal voltage generating circuit according to another embodiment of the present invention.

Referring to FIG. 5, an internal voltage generating circuit according to another embodiment of the present invention includes a supply voltage driving unit 40, a first internal voltage driving unit 41, a second internal voltage driving unit 42, and a control signal generating unit 43.

The supply voltage driving unit 40 includes diodes D40 and D41, a comparator 400, a PMOS transistor P40, a PMOS transistor P41, and an NMOS transistor N40. The diodes D40 and D41 are connected in series between a node nd41 and a node nd43 to divide a core voltage VCORE (i.e., a supply voltage) and output the same to a node nd42. The comparator 400 is configured to compare a signal of the node nd42 with a bias voltage VBIAS and generate a first pull-up signal PU40. The PMOS transistor P40 is configured to be turned on in response to the first pull-up signal PU40 and pull up the core voltage VCORE to a power supply voltage VDD. The PMOS transistor P41 operates as a driving element that is turned on in response to a fourth control signal CTR4 and pulls up the first pull-up signal PU40 to the power supply voltage VDD. The NMOS transistor N40 is configured to be turned on in response to the fourth control signal CTR4 and pull down the node nd43 to a ground voltage VSS.

Accordingly, when the fourth control signal CTR4 has a logic high level, the supply voltage driving unit 40 compares the signal of the node nd42, which is generated by dividing the core voltage VCORE, with the bias voltage VBIAS to determine whether to drive the core voltage VCORE. That is, when the signal of the node nd42 has a lower level than the bias voltage VBIAS, the PMOS transistor P40 of the supply voltage driving unit 40 is turned on, and pulls up the core voltage VCORE. On the other hand, when the fourth control signal CTR4 has a logic low level, the PMOS transistor P41 of the supply voltage driving unit 40 is turned on, pulls up the first pull-up signal PU40 to the power supply voltage VDD, and stops the driving of the core voltage VCORE.

The first internal voltage driving unit 41 includes a first comparator 410, a second comparator 411, a PMOS transistor P42, and an NMOS transistor N42. The first comparator 410 is configured to compare a bit line pre-charge voltage VBLP (i.e., an internal voltage) with a first lowest reference voltage VBLPL and generate a second pull-up signal PU41. The second comparator 411 is configured to compare the bit line pre-charge voltage VBLP with a first highest reference voltage VBLPH and generate a first pull-down signal PD41. The PMOS transistor P42 is configured to be turned on in response to the second pull-up signal PU41 and pull up the bit line pre-charge voltage VBLP. The NMOS transistor N42 is configured to be turned on in response to the first pull-down signal PD41 and pull down the bit line pre-charge voltage VBLP. Accordingly, when the bit line pre-charge voltage VBLP has a lower level than the first lowest reference voltage VBLPL, the first internal voltage driving unit 41 generates the second pull-up signal PU41 of a logic low level and drives the bit line pre-charge voltage VBLP to the core voltage VCORE. When the bit line pre-charge voltage VBLP has a higher level than the first lowest reference voltage VBLPL, the first internal voltage driving unit 41 generates the second pull-up signal PU41 of a logic high level to stop the driving of the bit line pre-charge voltage VBLP by the core voltage VCORE.

The second internal voltage driving unit 42 includes a third comparator 420, a fourth comparator 421, a PMOS transistor P43, and an NMOS transistor N43. The third comparator 420 is configured to compare a cell plate voltage VCP (i.e., an internal voltage) with a second lowest reference voltage VCPL and generate a third pull-up signal PU42. The fourth comparator 421 is configured to compare the cell plate voltage VCP with a second highest reference voltage VCPH and generate a third pull-down signal PD42. The PMOS transistor P43 is configured to be turned on in response to the third pull-up signal PU42 and pull up the cell plate voltage VCP. The NMOS transistor N43 is configured to be turned on in response to the second pull-down signal PD42 and pull down the cell plate voltage VCP. Accordingly, when the cell plate voltage VCP has a lower level than the second lowest reference voltage VCPL, the second internal voltage driving unit 42 generates the third pull-up signal PU42 of a logic low level and drives the cell plate voltage VCP to the core voltage VCORE. When the cell plate voltage VCP has a higher level than the second lowest reference voltage VCPL, the second internal voltage driving unit 42 generates the third pull-up signal PU42 of a logic high level to stop the driving of the cell plate voltage VCP by the core voltage VCORE.

The control signal generating unit 43 includes an inverter IV40, an inverter IV41, an inverter IV42, and an OR gate OR40. The inverter IV40 is configured to invert the second pull-up signal PU41. The inverter IV41 is configured to invert the third pull-up signal PU42. The inverter IV42 is configured to invert a power-up signal PWRUPB. The OR gate OR40 is configured to receive an output signal of the inverter IV40, an output signal of the inverter IV41 and an output signal of the inverter IV42, perform a logical OR operation on the output signal of the inverter IV40, the output signal of the inverter IV41 and the output signal of the inverter IV42, and generate the fourth control signal CTR4.

Hereinafter, a description will be given of the operation of the internal voltage generating circuit according to this embodiment, which is divided into an operation for the case where the bit line pre-charge voltage VBLP has a lower level than the first lowest reference voltage VBLPL in an active operation, an operation for the case where the cell plate voltage VCP has a lower level than the second lowest reference voltage VCPL, and an operation for the case where the bit line pre-charge voltage VBLP has a higher level than the first lowest reference voltage VBLPL and the cell plate voltage VCP has a higher level than the second lowest reference voltage VCPL.

When the bit line pre-charge voltage VBLP has a lower level than the first lowest reference voltage VBLPL, the bit line pre-charge voltage VBLP is driven to the core voltage VCORE in response to the second pull-up signal PU41 of a logic low level. In this case, the control signal generating unit 43 generates the fourth control signal CTR4 of a logic high level to turn off the PMOS transistor P41 of the supply voltage driving unit 40. Thus, the core voltage VCORE is driven according to the level of the first pull-up signal PU40.

When the cell plate voltage VCP has a lower level than the second lowest reference voltage VCPL, the cell plate voltage VCP is driven to the core voltage VCORE in response to the fourth pull-up signal PU42 of a logic low level. In this case, the control signal generating unit 43 generates the fourth control signal CTR4 of a logic high level to turn off the PMOS transistor P41 of the supply voltage driving unit 40. Thus, the core voltage VCORE is driven according to the level of the first pull-up signal PU40.

When where the bit line pre-charge voltage VBLP has a higher level than the first lowest reference voltage VBLPL and the cell plate voltage VCP has a higher level than the second lowest reference voltage VCPL, the driving of the bit line pre-charge voltage VBLP is stopped in response to the second pull-up signal PU41 of a logic high level and the driving of the cell plate voltage VCP is stopped in response to the third pull-up signal PU42 of a logic high level. In this case, the control signal generating unit 43 generates the fourth control signal CTR4 of a logic low level to turn off the PMOS transistor P41 of the supply voltage driving unit 40. Thus, the PMOS transistor P40 is turned off regardless of the level of the core voltage VCORE, to stop the driving of the core voltage VCORE.

As described above, even when an active operation is in progress, if there is no need to drive the bit line pre-charge voltage VBLP to the core voltage VCORE because the bit line pre-charge voltage VBLP has a higher level than the first lowest reference voltage VBLPL and there is no need to drive the cell plate voltage VCP to the core voltage VCORE because the cell plate voltage VCP has a higher level than the second lowest reference voltage VCPL, the internal voltage generating circuit of this embodiment stops the driving of the core voltage VCORE, thus reducing unnecessary power consumption.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. An internal voltage generating circuit comprising:
   a supply voltage driving unit configured to compare a voltage division signal of a supply voltage with a bias voltage, generate a first pull-up signal, and drive the supply voltage in response to the first pull-up signal;
   an internal voltage driving unit configured to receive the supply voltage, generate a second pull-up signal, and drive an internal voltage; and
   a driving control unit configured to select the first pull-up signal or a power supply voltage as a third pull-up signal in response to the second pull-up signal, and control the driving of the supply voltage.

2. The internal voltage generating circuit of claim 1, wherein when the voltage division signal of the supply voltage has a lower level than the bias voltage in an active operation, the supply voltage driving unit generates the first pull-up signal that is activated to drive the supply voltage.

3. The internal voltage generating circuit of claim 1, wherein when the internal voltage has a lower level than a lowest reference voltage, the internal voltage driving unit generates the second pull-up signal that is activated to drive the internal voltage.

4. The internal voltage generating circuit of claim 3, wherein when the internal voltage has a higher level than a highest reference voltage, the internal voltage driving unit generates a pull-down signal that is activated to discharge the internal voltage.

5. The internal voltage generating circuit of claim 1, wherein when the internal voltage has a higher level than a lowest reference voltage, the driving control unit transmits the power supply voltage as the third pull-up signal to stop the driving of the supply voltage.

6. The internal voltage generating circuit of claim 5, wherein the driving control unit comprises:
   a buffer configured to buffer the second pull-up signal and generate a control signal;
   a multiplexer configured to transmit the power supply voltage or the first pull-up signal as the third pull-up signal in response to the control signal; and
   a driving element configured to be turned on in response to the third pull-up signal and drive the supply voltage to the power supply voltage.

7. An internal voltage generating circuit comprising:
   a supply voltage driving unit configured to compare a voltage division signal of a supply voltage with a bias voltage, generate a first pull-up signal, and drive the supply voltage in response to the first pull-up signal;
   a first internal voltage driving unit configured to receive the supply voltage, generate a second pull-up signal, and drive a first internal voltage;
   a second internal voltage driving unit configured to receive the supply voltage, generate a third pull-up signal, and drive a second internal voltage; and
   a driving control unit configured to select the first pull-up signal or a power supply voltage as a fourth pull-up signal in response to the second pull-up signal and the third pull-up signal, and control the driving of the supply voltage.

8. The internal voltage generating circuit of claim 7, wherein when the voltage division signal of the supply voltage has a lower level than the bias voltage in an active operation, the supply voltage driving unit generates the first pull-up signal that is activated to drive the supply voltage.

9. The internal voltage generating circuit of claim 7, wherein when the first internal voltage has a lower level than a first lowest reference voltage, the first internal voltage driving unit generates the second pull-up signal that is activated to drive the first internal voltage.

10. The internal voltage generating circuit of claim 9, wherein when the first internal voltage has a higher level than a first highest reference voltage, the first internal voltage driving unit generates a first pull-down signal that is activated to discharge the first internal voltage.

11. The internal voltage generating circuit of claim 10, wherein when the second internal voltage has a lower level than a second lowest reference voltage, the second internal voltage driving unit generates the third pull-up signal that is activated to drive the second internal voltage.

12. The internal voltage generating circuit of claim 11, wherein when the second internal voltage has a higher level than a second highest reference voltage, the second internal voltage driving unit generates a second pull-down signal that is activated to discharge the second internal voltage.

13. The internal voltage generating circuit of claim 7, wherein when the first internal voltage has a higher level than a first lowest reference voltage or the second internal voltage has a higher level than a second lowest reference voltage, the driving control unit transmits the power supply voltage as the third pull-up signal to stop the driving of the supply voltage.

14. The internal voltage generating circuit of claim 13, wherein the driving control unit comprises:
   a control signal generating unit configured to receive the second pull-up signal and the third pull-up signal and generate a control signal;
   a multiplexer configured to transmit the power supply voltage or the first pull-up signal as the fourth pull-up signal in response to the control signal; and
   a driving element configured to be turned on in response to the fourth pull-up signal and drive the supply voltage to the power supply voltage.

15. An internal voltage generating circuit comprising:
   an internal voltage driving unit configured to receive a supply voltage, generate a first pull-up signal, and drive an internal voltage;
   a control signal generating unit configured to generate a control signal in response to the first pull-up signal; and
   a supply voltage driving unit configured to compare a voltage division signal of the supply voltage with a bias voltage, and generate a second pull-up signal for driving the supply voltage,
   wherein the second pull-up signal is driven in response to the control signal.

16. The internal voltage generating circuit of claim 15, wherein when the internal voltage has a lower level than a lowest reference voltage, the internal voltage driving unit generates the first pull-up signal that is activated to drive the internal voltage.

17. The internal voltage generating circuit of claim 16, wherein when the internal voltage has a higher level than a highest reference voltage, the internal voltage driving unit generates a pull-down signal that is activated to discharge the internal voltage.

18. The internal voltage generating circuit of claim 15, wherein, the control signal generating unit generates the control signal that is deactivated when an power-up period ends and the internal voltage has a higher level than a lowest reference voltage.

19. The internal voltage generating circuit of claim 18, wherein the supply voltage driving unit comprises a driving element configured to drive the second pull-up signal to a power supply voltage when the control signal is deactivated.

20. An internal voltage generating circuit comprising:
- a first internal voltage driving unit configured to receive a supply voltage, generate a first pull-up signal, and drive a first internal voltage;
- a second internal voltage driving unit configured to receive the supply voltage, generate a second pull-up signal, and drive a second internal voltage;
- a control signal generating unit configured to generate a control signal in response to the first pull-up signal and the second pull-up signal; and
- a supply voltage driving unit configured to compare a voltage division signal of the supply voltage with a bias voltage, and generate a third pull-up signal for driving the supply voltage, wherein the third pull-up signal is driven in response to the control signal.

21. The internal voltage generating circuit of claim 20, wherein when the first internal voltage has a lower level than a lowest reference voltage, the first internal voltage driving unit generates the first pull-up signal that is activated to drive the first internal voltage.

22. The internal voltage generating circuit of claim 21, wherein when the first internal voltage has a higher level than a highest reference voltage, the first internal voltage driving unit generates a pull-down signal that is activated to discharge the first internal voltage.

23. The internal voltage generating circuit of claim 20, wherein when the second internal voltage has a lower level than a lowest reference voltage, the second internal voltage driving unit generates the second pull-up signal that is activated to drive the second internal voltage.

24. The internal voltage generating circuit of claim 23, wherein when the second internal voltage has a higher level than a highest reference voltage, the second internal voltage driving unit generates a pull-down signal that is activated to discharge the second internal voltage.

25. The internal voltage generating circuit of claim 20, wherein the control signal generating unit generates the control signal that is deactivated when an power-up period ends, the first internal voltage has a higher level than a first lowest reference voltage and the second internal voltage has a higher level than a second lowest reference voltage.

26. The internal voltage generating circuit of claim 20, wherein the supply voltage driving unit comprises a driving element configured to drive the third pull-up signal to a power supply voltage when the control signal is deactivated.

* * * * *